(12) United States Patent
Abura et al.

(10) Patent No.: US 10,042,257 B2
(45) Date of Patent: Aug. 7, 2018

(54) RESIN LAMINATE AND RELIEF PRINTING ORIGINAL PLATE

(71) Applicant: Toray Industries, Inc., Tokyo (JP)

(72) Inventors: Tsutomu Abura, Okazaki (JP); Kenji Ido, Okazaki (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 15/118,988

(22) PCT Filed: Feb. 16, 2015

(86) PCT No.: PCT/JP2015/054087
§ 371 (c)(1),
(2) Date: Aug. 15, 2016

(87) PCT Pub. No.: WO2015/122515
PCT Pub. Date: Aug. 20, 2015

(65) Prior Publication Data
US 2016/0349615 A1    Dec. 1, 2016

(30) Foreign Application Priority Data

Feb. 17, 2014 (JP) ................. 2014-027142

(51) Int. Cl.
| | |
|---|---|
| *G03F 7/11* | (2006.01) |
| *G03F 7/038* | (2006.01) |
| *G03F 7/085* | (2006.01) |
| *G03F 7/09* | (2006.01) |
| *G03F 7/20* | (2006.01) |
| *B32B 27/00* | (2006.01) |
| *B41N 1/12* | (2006.01) |
| *B41N 6/00* | (2006.01) |
| *B41M 9/02* | (2006.01) |

(52) U.S. Cl.
CPC ............. *G03F 7/11* (2013.01); *G03F 7/038* (2013.01); *G03F 7/0387* (2013.01); *G03F 7/085* (2013.01); *G03F 7/092* (2013.01); *G03F 7/202* (2013.01); *B32B 27/00* (2013.01); *B41M 9/02* (2013.01); *B41N 1/12* (2013.01); *B41N 6/00* (2013.01)

(58) Field of Classification Search
CPC .... G03F 7/11; B41N 1/12; B41N 1/22; B41C 1/055; B41C 1/05
See application file for complete search history.

(56) References Cited

U.S. PATENT DOCUMENTS

| | | | | |
|---|---|---|---|---|
| 4,269,931 | A * | 5/1981 | Suzuki | G03F 7/029 430/271.1 |
| 2007/0243486 | A1 * | 10/2007 | Katayose | C09D 133/14 430/270.1 |
| 2015/0367668 | A1 * | 12/2015 | Kawahara | G03F 7/037 101/401.1 |

FOREIGN PATENT DOCUMENTS

| | | |
|---|---|---|
| JP | 04-204447 A | 7/1992 |
| JP | 11-231546 A | 8/1999 |
| JP | 2007-224093 A | 9/2007 |
| JP | 2008-181059 A | 8/2008 |
| JP | 2008-246967 A | 10/2008 |
| JP | 2009-168907 A | 7/2009 |
| JP | 2009-237174 A | 10/2009 |
| JP | 2009-288700 A | 12/2009 |
| JP | 2010-085765 A | 4/2010 |
| WO | 2010/150844 A1 | 12/2010 |
| WO | 2012/043322 A1 | 4/2012 |
| WO | 2014/021322 A1 | 2/2014 |

* cited by examiner

*Primary Examiner* — Cynthia Hamilton
(74) *Attorney, Agent, or Firm* — DLA Piper LLP (US)

(57) ABSTRACT

A resin laminate having a structure in which a support, an intermediate layer and an image-forming resin layer are laminated in the order mentioned, the resin laminate including (A) a cationic polymer in the image-forming resin layer, and (B) an anionic polymer in the intermediate layer in contact with image-forming resin layer, wherein the (B) anionic polymer is a modified and partially saponified polyvinyl acetate in which a carboxyl group is introduced to a polymer side chain using a hydroxyl group of a partially saponified polyvinyl acetate as an origin of introduction.

10 Claims, No Drawings

RESIN LAMINATE AND RELIEF PRINTING ORIGINAL PLATE

TECHNICAL FIELD

This disclosure relates to a laminate comprising an intermediate layer between a support and an image-forming resin layer; and a relief printing plate original.

BACKGROUND

A relief printing plate is generally composed of a support such as a metal or plastic substrate, and a relief-formed resin layer arranged thereon. Examples of a method of preparing a relief printing plate in which irregularities are formed on a resin layer as a relief include the following:
  i) a method of forming a relief by exposing a photosensitive resin layer, on which an image can be formed, to UV light through a negative film; selectively curing an image part; and then removing uncured part using a developer (analog platemaking),
  ii) a method of forming a relief by arranging a laser-sensitive mask layer element capable of forming an image mask on a photosensitive resin layer on which an image can be formed; irradiating thereto a laser beam based on image data controlled by a digital device; forming an image mask from the mask layer element at this point; subsequently exposing the resultant to UV light through an image mask; selectively curing an image part; and then removing uncured part using a developer (CTP platemaking), and
  iii) a method of forming irregularities as a relief by engraving a resin layer with a laser beam (laser engraving platemaking).

The thus obtained plate is immobilized on a plate cylinder of a printing machine using a double-sided adhesive tape, a magnet or the like or by vacuuming and subsequently subjected to printing. Therefore, during the plate-making (especially during development) as well as printing, the support and the resin layer should never be detached from each other. In addition, for storage of the thus printed plate for re-printing, it is required that the support and the relief be firmly adhered to each other such that the relief does not peel off from the support when the printed plate is removed from the plate cylinder.

As a method of adhering a support with a relief-forming resin, it has been proposed to arrange a variety of intermediate layers between the support and the resin layer. Japanese Patent Application Laid-Open Publication (JP-A) No. 2008-181059 discloses a method of adhering a photosensitive resin layer, which yields a relief, and a support using a copolymerized polyester resin and a polyfunctional isocyanate. JP-A No. 2007-224093 discloses a method of adhering a photosensitive resin layer, which yields a relief, and a support using an intermediate layer comprising a carboxyl group-containing polymer and an oxazoline group-containing polymer. JP-A No. H11-231546 discloses a method where two intermediate layers, which are a first intermediate layer having good adhesion with a support and a second intermediate layer comprising a reactive group-containing compound for improvement of the adhesion with a photosensitive resin layer that yields a relief, are arranged.

In a prior art method using a reactive compound as an intermediate layer to adhere a support and a relief-forming resin layer, the reactive compound may be deactivated during storage of the resulting printing plate original or printing plate and the adhesive strength is thereby weakened, causing a defect that the relief peels off from the support during platemaking or printing.

It could therefore be helpful to provide a way to inhibit peeling between a support and an image-forming resin layer.

SUMMARY

We thus provide:
(1) A resin laminate having a structure in which a support, an intermediate layer and an image-forming resin layer are laminated in the order mentioned, the resin laminate comprising: (A) a cationic polymer in the image-forming resin layer; and (B) an anionic polymer in the intermediate layer that is in contact with the image-forming resin layer.

Preferred examples include the following resin laminates:
(2) The above-described laminate, wherein the intermediate layer comprises a first intermediate layer and a second intermediate layer in the order mentioned from the side of the support, and the second intermediate layer in contact with the image-forming resin layer comprises the (B) anionic polymer;
(3) Any one of the above-described resin laminates, wherein the image-forming resin layer is a photosensitive resin layer;
(4) Any one of the above-described resin laminates, wherein the (A) cationic polymer is an amino group-containing polymer;
(5) Any one of the above-described resin laminates, wherein the (A) cationic polymer is a piperazine ring-containing polyamide;
(6) Any one of the above-described resin laminates, wherein the image-forming resin layer comprises: the (A) cationic polymer; (C) a partially saponified polyvinyl acetate having a saponification degree of 40 to 100% by mol; (D) a compound having a polymerizable ethylenic double bond; and (E) a photopolymerization initiator;
(7) The above-described resin laminate, wherein the (C) partially saponified polyvinyl acetate having a saponification degree of 40 to 100% by mol is a modified and partially saponified polyvinyl acetate having a reactive group in a side chain;
(8) Any one of the above-described resin laminates, wherein the (B) anionic polymer comprises a carboxyl group, a sulfonate group, a phosphate group, or a functional group composed of a salt thereof;
(9) Any one of the above-described resin laminates, wherein the (B) anionic polymer is a water-soluble or water-dispersible copolymer which comprises a carboxyl group, a sulfonate group, a phosphate group, or a functional group composed of a salt thereof;
(10) Any one of the above-described resin laminates, wherein the (B) anionic polymer is a modified and partially saponified polyvinyl acetate in which a carboxyl group is introduced to a polymer side chain using a hydroxyl group of a partially saponified polyvinyl acetate as an origin of introduction; and
(11) Any one of the above-described resin laminates, which is formed by laminating the image-forming resin layer on the intermediate layer arranged on the support.

We further provide a relief printing plate original comprising any one of the above-described resin laminates.

A relief printing plate original in which peeling between a support and an image-forming resin layer is unlikely to occur can thus be obtained.

DETAILED DESCRIPTION

We provide a resin laminate having a structure in which a support, an intermediate layer and an image-forming resin layer are laminated in the order mentioned, the resin laminate being characterized by comprising: (A) a cationic polymer in the image-forming resin layer; and (B) an anionic polymer in the intermediate layer that is in contact with the image-forming layer.

A resin laminate may have a structure in which a support, a first intermediate layer, a second intermediate layer and an image-forming resin layer are laminated in the order mentioned, the resin laminate comprising: (A) a cationic polymer in the image-forming resin layer; and (B) an anionic polymer in the second intermediate layer that is in contact with the image-forming resin layer.

Good developing properties can be obtained by incorporating (A) a cationic polymer in the image-forming resin layer, and incorporation of the (A) cationic polymer into the image-forming resin layer and (B) an anionic polymer into the intermediate layer or second intermediate layer in contact with the image-forming layer provides an effect of improving the interlayer adhesion due to electrostatic attraction between cations and anions.

We define the (A) cationic polymer to be contained in the image-forming resin layer. The (A) cationic polymer is a polymer having a basic group as a part of its main chain or side chain, which basic group is capable of undergoing a neutralization reaction with an acid, or a polymer having a cationic group. Examples of the basic group capable of undergoing a neutralization reaction with an acid include primary, secondary and tertiary amino groups. Examples of the cationic group include, in addition thereto, quaternary ammonium salt groups and quaternary phosphonium salt groups. Examples of such (A) cationic polymer include primary amino group-containing acrylic polymers in which polyethyleneimine is grafted into a side chain; acrylic polymers copolymerized with a cationic group-containing (meth)acryl monomer; amino group-copolymerized polyvinyl acetates; amino group-copolymerized polyvinyl alcohols; and amino group-containing polyamides.

A polyamide having an amino group in the main chain can be obtained by, for example, a polycondensation or polyaddition reaction using an amino group-containing monomer individually or in combination with other monomer(s). The polyamide having an amino group is preferably piperazine or an N,N-dialkylamino group-containing polyamide, more preferably piperazine. Specific examples of the amino group-containing monomer used to provide such a preferred polyamide include:

diamines such as, N,N'-bis(aminomethyl)-piperazine, N,N'-bis(β-aminoethyl)-piperazine, N,N'-bis(γ-aminobenzyl)-piperazine, N-(β-aminoethyl)piperazine, N-(β-amino-propyl)piperazine, N-(ω-aminohexyl)piperazine, N-(β-aminoethyl)-2,5-dimethylpiperazine, N,N-bis(β-aminoethyl)-benzylamine, N,N-bis(γ-aminopropyl)-amine, N,N'-dimethyl-N,N'-bis(γ-aminopropyl)-ethylenediamine and N,N'-dimethyl-N,N'-bis(γ-aminopropyl)-tetramethylenediamine;

dicarboxylic acids and lower alkyl esters thereof such as N,N'-bis(carboxymethyl)-piperazine, N,N'-bis(carboxymethyl)-methylpiperazine, N,N'-bis(carboxymethyl)-2,6-dimethylpiperazine, N,N'-bis(β-carboxyethyl)-piperazine, N,N-bis(carboxymethyl)-methylamine, N,N-bis(β-carboxyethyl)-ethylamine, N,N-bis(β-carboxyethyl)-methylamine, N,N-di(β-carboxyethyl)-isopropylamine, N,N'-dimethyl-N,N'-bis-(carboxymethyl)-ethylenediamine and N,N'-dimethyl-N,N'-bis-(β-carboxyethyl)-ethylenediamine; and ω-amino acids such as N-(aminomethyl)-N'-(carboxymethyl)-piperazine, N-(aminomethyl)-N'-(β-carboxyethyl)-piperazine, N-(β-aminoethyl)-N'-(β-carboxyethyl)-piperazine, N-carboxymethylpiperazine, N-(β-carboxyethyl)piperazine, N-(γ-carboxyhexyl)piperazine, N-(ω-carboxyhexyl)piperazine, N-(aminomethyl)-N-(carboxymethyl)-methylamine, N-(β-aminoethyl)-N-(β-carboxyethyl)-methylamine, N-(aminomethyl)-N-(β-carboxyethyl)-isopropylamine and N,N'-dimethyl-N-(aminomethyl)-N'-(carboxymethyl)-ethylenediamine.

These monomers can also be used in combination with, for example, other diamine, dicarboxylic acid, ω-amino acid and/or lactam.

It is preferred that such (A) cationic polymer be contained in the image-forming resin layer in an amount of 3 to 70% by mass. By incorporating the (A) cationic polymer in an amount of 3% by mass or greater, an electrostatic attraction between the (A) cationic polymer and the (B) anionic polymer contained in the intermediate layer that is in contact with the image-forming resin layer allows expression of good adhesion. Further, the total content of a basic group and/or a cationic group in the (A) cationic polymer is preferably not less than 0.1 mol/kg, more preferably not less than 0.5 mol/kg. The term "good adhesion" refers to an adhesive strength of 2 N or greater per width of 1 cm (2 N/cm). Meanwhile, by controlling the amount of the (A) cationic polymer to be 70% by mass or less, tackiness of the image-forming resin layer can be suppressed.

Further, it is preferred that the image-forming resin layer contain (C) a partially saponified polyvinyl acetate having a saponification degree of 40 to 100% by mol. By incorporating the compound (C), the film-forming properties are improved so that an image-forming resin layer with good thickness accuracy can be formed.

In addition, a reactive group can be introduced to a side chain of the compound (C). The "reactive group" refers to a functional group that can be cross-linked by radical reaction or the like. In general, as such a functional group, a non-aromatic unsaturated carbon-carbon bond, particularly an ethylenic double bond, is normally used in many cases, and examples of the functional group include a vinyl group and a (meth)acryloyl group.

Introduction of such a reactive group enables to form a finer relief image by a method where an image-forming photosensitive resin layer is exposed to UV light through a negative film, the thus exposed part is selectively cured and uncured part is then removed with a developer.

Examples of a method of introducing such a reactive group to a side chain of a partially saponified polyvinyl acetate include the following methods.

As a first method, for example, a partially saponified polyvinyl acetate is allowed to react with an acid anhydride; a carboxyl group is introduced to a side chain of the resulting polymer using the hydroxyl group of the partially saponified polyvinyl acetate as the origin of the introduction; and this carboxyl group is then allowed to react with an unsaturated epoxy compound, thereby a reactive group is introduced. As a second method, for example, a polymer obtained by copolymerization between vinyl acetate and an unsaturated carboxylic acid, a salt thereof or an unsaturated carboxylic acid ester, is partially saponified and the carboxyl group of this polymer is then allowed to react with an unsaturated epoxy compound, thereby a reactive group is introduced. Particularly, a partially saponified polyvinyl acetate obtained by the former method is preferably used because it allows the desired effects to be prominently expressed.

Examples of a method of introducing a reactive group into a side chain of the compound (C) include a method of allowing a carboxyl group of a partially saponified polyvinyl acetate (component (B)) having a carboxyl group as an anionic group to react with an unsaturated epoxy compound. When the compound (C) synthesized by the above-described method is incorporated, it is preferred that the number of unreacted anionic groups originated from the component (B) contained in the image-forming resin layer be in a range that does not exceed the number of cationic groups contained in the component (A).

In the compound (C), such a reactive group exists in an amount of preferably 0.08 to 0.72 mol/kg, more preferably 0.12 to 0.36 mol/kg. When the amount is greater than 0.72 mol/kg, since the compound (C) has poor solubility to water, a satisfactory level of water developability cannot be attained in many cases. Meanwhile, when the amount is less than 0.08 mol/kg, the effect of inhibiting the generation of relief cracks and the like during development, which is improved by reaction of the reactive group, may not be expressed in many cases. The (C) modified and partially saponified polyvinyl acetate having a reactive group obtained in this manner comprises at least structural units (I), (II) and (III):

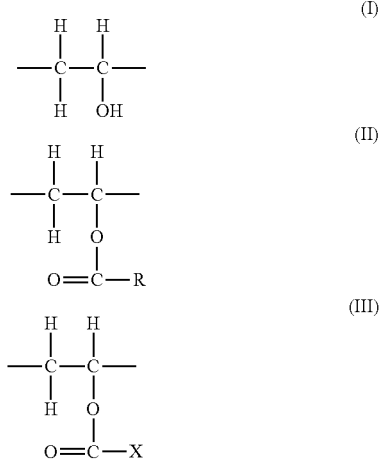

wherein R represents a hydrocarbon group having 1 to 20 carbon atoms; and X represents a functional group having an unsaturated carbon-carbon bond at a terminal.

When the (C) partially saponified polyvinyl acetate having a reactive group in a side chain is required to be developable with water, it comprises structural unit (I) in an amount of preferably 60 to 99% by mol, more preferably 70 to 95% by mol. When the amount of structural unit (I) is excessively small, the water solubility is reduced and sufficient water developability may thus not be attained, whereas when the amount is excessively large, the solubility to normal-temperature water is reduced so that sufficient water developability cannot be attained in many cases. Further, the average polymerization degree of compound (C) is preferably 300 to 2,000, more preferably 500 to 1,000. When the average polymerization degree is lower than 300, the water resistance is reduced and sufficient water resistance cannot be attained. Meanwhile, when the average polymerization degree is higher than 2,000, the water solubility is markedly reduced and sufficient water developability cannot be attained. The number-average molecular weight of compound (C) is preferably 10,000 to 150,000.

It is preferred that component (C) be contained in the image-forming resin layer in an amount of 10 to 70% by mass. By incorporating component (C) in an amount of 10 to 70% by mass, an image-forming resin layer with high thickness accuracy can be formed.

The image-forming resin layer may also contain (D) a compound having a polymerizable ethylenic double bond. However, among those compounds described above, ones having a polymerizable ethylenic double bond are not included in the component (D) by definition.

The content of component (D) is preferably 5 to 200 parts by mass with respect to 100 parts by mass of the total amount of components (A) and (C). If the content is less than 5 parts by mass, the image reproducibility tends to be inadequate when an image is formed by a method where the image-forming resin layer is exposed to UV light, an image part is selectively cured and uncured part is then removed with a developer, whereas a content of higher than 200 parts by mass tends to make it difficult to mold.

When an image is formed by a method where the image-forming resin layer is exposed to UV light, an image part is selectively cured and uncured part is then removed with a developer, (E) a photopolymerization initiator is generally added to the image-forming resin layer. As the photopolymerization initiator, any photopolymerization initiator that is capable of polymerizing a polymerizable carbon-carbon unsaturated group with light can be used. Among such photopolymerization initiators, one which has a function of generating a radical by self-decomposition or hydrogen abstraction induced by light absorption is preferably used. Examples thereof include benzoin alkyl ethers, benzophenones, anthraquinones, benzyls, acetophenones and diacetyls. The (E) photopolymerization initiator is preferably added in a range of 0.1 to 20 parts by mass with respect to 100 parts by mass of the total amount of components (A) and (C).

In the image-forming resin layer, as a compatibilizing aid to improve compatibility and flexibility, a polyhydric alcohol such as ethylene glycol, diethylene glycol, triethylene glycol, glycerin or a derivative thereof, trimethylolpropane or a derivative thereof, trimethylolethane or a derivative thereof, or pentaerythritol or a derivative thereof, can also be added. The amount of the polyhydric alcohol is preferably 40% by mass or less with respect to the whole resin composition forming the resin layer.

To improve thermal stability of the image-forming resin layer, a conventionally known polymerization inhibitor can be added. Examples of a preferred polymerization inhibitor include phenols, hydroquinones, catechols and hydroxylamine derivatives. The polymerization inhibitor is generally added in a range of 0.001 to 5% by mass with respect to the whole resin composition forming the resin layer.

Further, in the image-forming resin layer, as other component(s), for example, a dye, a pigment, a surfactant, an antifoaming agent, a UV absorber and/or a flavoring agent may be added.

The laminate comprises (B) an anionic polymer in the intermediate layer in contact with the image-forming resin layer. Defining the (B) anionic polymer, the (B) anionic polymer is a polymer having an acidic group as a part of its main chain or side chain, which acidic group is capable of undergoing a neutralization reaction with a base, or a polymer having an anionic group. Examples of the acidic group capable of undergoing a neutralization reaction with a base include a carboxyl group, a sulfonate group and a phosphate group, and examples of the anionic group include polymers composed of a salt thereof. Examples of such (B) anionic polymer include anionic (meth)acryl monomer-copolymerized acrylic polymers, polyvinyl acetates and polyvinyl alcohols; and polymers obtained by allowing a partially saponified polyvinyl acetate to react with an acid anhydride and introducing a carboxyl group to a side chain of the resulting polymer using the hydroxyl group of the partially saponified polyvinyl acetate as the origin of the introduction. From the standpoints of the compatibility and adhesion with the image-forming resin layer, the (B) anionic polymer is preferably a polymer obtained by allowing a partially saponified polyvinyl acetate having a saponification degree of 40 to 100 mole % to react with an acid anhydride and introducing a carboxyl group, which is an acidic group, to a side chain of the resulting polymer using the hydroxyl group of the partially saponified polyvinyl acetate as the origin of the introduction.

The resin laminate may be a resin laminate having a structure in which a support, a first intermediate layer, a second intermediate layer and an image-forming resin layer are laminated in the order mentioned, and the second intermediate layer in contact with the image-forming resin layer comprises (B) an anionic polymer. Examples of this (B) anionic polymer contained in the second intermediate layer include the same polymers as those exemplified above for when the intermediate layer is a single layer.

It is preferred that the (B) anionic polymer be contained in the intermediate layer in contact with the image-forming resin layer in an amount of not less than 5% by mass. By incorporating the (B) anionic polymer in an amount of 5% by mass to 100% by mass, an electrostatic attraction between the (B) anionic polymer and the (A) cationic polymer contained in the image-forming resin layer allows expression of good adhesion. Further, the total content of an acidic group and/or an anionic group in the (B) anionic polymer is preferably not less than 0.1 mol/kg, more preferably not less than 0.5 mol/kg.

Next, a relief printing plate original comprising the laminate will be described. The laminate comprises at least: a support (F); and, on the support (F), an intermediate layer (G) and an image-forming resin layer (H) in that order.

As support (F), a plastic sheet made of polyester or the like, a synthetic rubber sheet made of styrene-butadiene rubber or the like, or a metal plate made of steel, stainless-steel, aluminum or the like can be used.

The thickness of support (F) is not particularly restricted. However, from the standpoints of the ease of handling and the flexibility, it is preferably 100 to 350 µm. That support has an improved ease of handling when its thickness is 100 µm or greater, while the flexibility of the printing plate original is improved when the support has a thickness of 350 µm or less.

For the purpose of improving the adhesion of support (F) with intermediate layer (G), the surface of support (F) may be subjected to a mechanical treatment such as sand blasting or a physical treatment such as corona discharge.

Intermediate layer (G) can be formed by flow-casting or coating an intermediate layer composition solution, which is prepared by dissolving the components of the intermediate layer in a solvent, on the support and subsequently drying the solution. Further, the intermediate layer can also be formed in a plurality of layers such as a first intermediate layer (G1) and a second intermediate layer (G2).

Image-forming resin layer (H) can be formed by further flow-casting and then drying a composition solution prepared by dissolving the components of the resin layer in a solvent. From the standpoint of allowing image-forming resin layer (H) to have a sufficient relief depth and thereby improving the printability, the thickness of image-forming resin layer (H) is preferably not less than 0.3 mm, more preferably not less than 0.5 mm. On another front, from the standpoint of allowing an active light used for exposure to sufficiently reach the bottom part and thereby further improving the image reproducibility, the thickness of image-forming resin layer (H) is preferably 5 mm or less, more preferably 3 mm or less.

From the standpoints of protecting the surface and inhibiting adhesion of foreign matters and the like, it is preferred that the laminate comprise a cover film (I) on image-forming resin layer (H). Image-forming resin layer (H) and cover film (I) may be in direct contact with each other, or one or more layers may be arranged therebetween. Examples of a layer arranged between image-forming resin layer (H) and cover film (I) include an anti-adhesion layer arranged for the purpose of inhibiting adhesion on the surface of a photosensitive resin layer.

The material of cover film (I) is not particularly restricted, and a plastic sheet made of polyester, polyethylene or the like is preferably used. The thickness of cover film (I) is also not particularly restricted; however, from the standpoints of the ease of handling and the cost, it is preferably 10 to 150 µm. Further, the surface of the cover film may be roughened for the purpose of improving its adhesion with an original image film.

The resin laminate may further comprise a heat-sensitive mask layer (J) on image-forming resin layer (H) which is a photosensitive resin layer. It is preferred that heat-sensitive mask layer (J) substantially blocking UV light and absorb infrared laser light at the time of image formation to be, by the heat thereof, partially or entirely sublimated or melted away in an instant. This generates a difference in optical density between the laser-irradiated part and the non-irradiated part, allowing heat-sensitive mask layer (J) to function in the same manner as a conventional original image film.

The function to "blocking UV light" means that heat-sensitive mask layer (J) has an optical density of 2.5 or higher, preferably 3.0 or higher. The optical density is generally denoted as "D" and defined by the following equation:

$$D = \log_{10}(100/T) = \log_{10}(I_0/I)$$

wherein, T represents the transmittance (%); $I_0$ represents the intensity of incident light used in the measurement of the transmittance; and I represents the intensity of transmitted light.

For the measurement of the optical density, there are known a method of calculating the optical density from a measured value of the intensity of transmitted light with the intensity of incident light being set constant, and a method of calculating the optical density from a measured value of the intensity of incident light required for achieving a certain intensity of transmitted light. The optical density refers to a value calculated from the intensity of transmitted light by the former method.

The optical density can be measured using a Macbeth transmission densitometer "TR-927" (manufactured by Kollmorgen Instruments Corp.) along with an orthochromatic filter.

One preferred specific example of heat-sensitive mask layer (J) is a resin layer in which an infrared-absorbing material is dispersed. The infrared-absorbing material is not particularly restricted as long as it is a substance capable of absorbing infrared light and converting it into heat. Examples thereof include black pigments such as carbon black, aniline black and cyanine black; phthalocyanine-based and naphthalocyanine-based green pigments; rhodamine dyes; naphthoquinone dyes; polymethine dyes; diimonium salts; azoimonium dyes; chalcogen dyes; carbon graphite; iron powder; diamine-based metal complexes; dithiol-based metal complexes; phenol thiol-based metal complexes; mercaptophenol-based metal complexes; aryl aluminum metal salts; crystal water-containing inorganic compounds; copper sulfate; chromium sulfide; silicate compounds; metal oxides such as titanium oxide, vanadium oxide, manganese oxide, iron oxide, cobalt oxide and tungsten oxide; hydroxides and sulfates of these metals; and metal powders of bismuth, tin, tellurium, iron, aluminum and the like.

Thereamong, carbon black is particularly preferred from the standpoints of the photothermal conversion rate, economic efficiency and ease of handling as well as the below-described UV-absorbing function. A resin component to be used as a binder is not particularly restricted. However, from the standpoints of the stability and scratch resistance of heat-sensitive mask layer (J), a thermosetting resin can be preferably used.

The relief printing plate original comprising the resin laminate may also comprise an adhesion-adjusting layer (K) between image-forming resin layer (H) and heat-sensitive mask layer (J). It is preferred that adhesion-adjusting layer (K) contain a water-soluble and/or water-dispersible resin such as a partially saponified polyvinyl acetate having a saponification degree of not less than 30% by mol or a polyamide. Further, adhesion-adjusting layer (K) may also contain a resin or monomer for optimization of the adhesive strength and/or an additive(s) such as a surfactant and a plasticizer to ensure coating performance and stability.

The thickness of adhesion-adjusting layer (K) is preferably 15 μm or less, more preferably not less than 0.1 μm, but not greater than 5 μm. As long as the thickness is 15 μm or less, refraction and scattering of light caused by the layer when exposed to UV light are inhibited so that a sharper relief image can be obtained. Further, adhesion-adjusting layer (K) can be easily formed at a thickness of 0.1 μm or greater.

The relief printing plate original comprising the resin laminate may further comprise a peel assist layer (L) on heat-sensitive mask layer (J). Peel assist layer (L) is preferably arranged between heat-sensitive mask layer (J) and cover film (I). It is preferred that peel assist layer (L) have a function of allowing only peel assist layer (L) itself, only cover film (I) or both of cover film (I) and peel assist layer (L) to be easily peeled off from the printing plate original. When cover film (I) and heat-sensitive mask layer (J) are laminated adjacent to each other and the adhesion between these two layers is strong, cover film (I) cannot be peeled off or, when it is peeled off, heat-sensitive mask layer (J) may be partially left adhered to the side of cover film (I), generating a void on heat-sensitive mask layer (J).

Therefore, it is preferred that peel assist layer (L) be constituted of a substance that strongly adheres to heat-sensitive layer (J) but weakly adheres to cover film (I) such that it can be peeled off therefrom, or a substance that strongly adheres to cover film (I), but weakly adheres to heat-sensitive mask layer (J) such that it can be peeled off therefrom. After cover film (I) is peeled off, since peel assist layer (L) may remain on the side of heat-sensitive mask layer (J) and serve as the outermost layer, it is preferred that peel assist layer (L) be not adhesive from the standpoint of the ease of handling and be substantially transparent to perform exposure with UV light therethrough.

Examples of a material used for peel assist layer (L) include polyvinyl alcohols, polyvinyl acetates, partially saponified polyvinyl alcohols, hydroxyalkyl celluloses, alkyl celluloses and polyamide resins, and it is preferred that peel assist layer (L) contain, as a main component, a resin that is soluble or dispersible in water and weakly adhesive. Among these materials, from the standpoint of the adhesiveness, partially saponified polyvinyl alcohols having a saponification degree of 60 to 99% by mol as well as hydroxyalkyl celluloses and alkyl celluloses whose alkyl groups have 1 to 5 carbon atoms can be particularly preferably used.

Peel assist layer (L) may further contain an infrared-absorbing material to be easily melted away using infrared radiation. Examples of the infrared-absorbing material that can be used include the same ones as those exemplified above for heat-sensitive mask layer (J). In addition, to improve the coating properties, wettability and peeling properties, a surfactant may be incorporated into peel assist layer (L). Particularly, by incorporating a phosphate-based surfactant into peel assist layer (L), the peelability from cover film (I) is improved.

The thickness of peel assist layer (L) is preferably 6 μm or less, more preferably not less than 0.1 μm but not greater than 1 μm. As long as the thickness of peel assist layer (L) is 1 μm or less, the laser ablation properties of underlying heat-sensitive mask layer (J) are not impaired. Further, it is easy to form peel assist layer (L) at a thickness of 0.1 μm or greater.

Next, a method of producing the resin laminate will be described. For example, after heat-dissolving components (A) and (C) in a water/alcohol mixed solvent, the compound of component (D), the (E) photopolymerization initiator and, as required, a plasticizer and other additive(s) are added, and the resultant is sufficiently mixed by stirring to obtain a resin composition solution that forms an image-forming resin layer.

The thus obtained resin composition solution is flow-cast on a polyethylene terephthalate film and subsequently dried to form image-forming resin layer (H).

Then, component (B) is heat-dissolved in a water/alcohol mixed solvent, and the resultant is sufficiently mixed by stirring to obtain an intermediate layer composition solution.

The thus obtained intermediate layer composition solution is coated on support (F) using a bar coater and subsequently dried to form a laminate composed of support (F) and intermediate layer (G).

The laminate is obtained by laminating thereon sheet (H), which is an image-forming resin layer such that sheet (H) is sandwiched between support (F)/intermediate layer (G) and cover film (I).

When the laminate comprises heat-sensitive mask layer (J), the method of forming heat-sensitive mask layer (J) is not particularly restricted and, for example, heat-sensitive mask layer (J) can be formed by dissolving and diluting a resin, in which carbon black is dispersed, with an appropriate solvent, coating the resulting solution on image-forming resin layer (H) and then drying the solvent. The laminate can also be formed by, after coating the above-described carbon black solution on cover film (I) to form a laminate composed of heat-sensitive mask layer (J) and cover film (I), laminating thereon image-forming resin layer (H) such that image-forming resin layer (H) is sandwiched between heat-sensitive mask layer (J)/cover film (I) and support (F)/intermediate layer (G).

When the resin laminate comprises adhesion-adjusting layer (K), the method of forming adhesion-adjusting layer (K) is not particularly restricted. However, from the standpoint of the simplicity of forming a thin film, a method where a solution in which the component(s) of adhesion-adjusting layer (K) is/are dissolved in a solvent is coated on heat-sensitive mask layer (J) and the solvent is subsequently removed is particularly preferably employed. Examples of a method of removing the solvent include hot-air drying, far-infrared drying and natural drying. The solvent used for dissolving the component(s) of adhesion-adjusting layer (K) is also not particularly restricted. However, water, an alcohol or a mixture of water and an alcohol is preferably used. When water or an alcohol is used as the solvent and heat-sensitive mask layer (J) is insoluble to water, heat-sensitive mask layer (J) is not corroded even if the solution is coated thereon, which is preferred.

When the resin laminate comprises peel assist layer (L), the method of forming peel assist layer (L) is not particularly restricted. However, from the standpoint of the simplicity of forming a thin film, a method where a solution in which the component(s) of peel assist layer (L) is/are dissolved in a solvent is coated on cover film (I) and the solvent is subsequently removed is particularly preferably employed. Examples of a method of removing the solvent include hot-air drying, far-infrared drying and natural drying. The solvent used to dissolve the component(s) of peel assist layer (L) is also not particularly restricted. However, water, an alcohol or a mixture of water and an alcohol is preferably used.

Next, a method of producing a relief printing plate comprising the resin laminate will be described.

A relief printing plate formed from the laminate can be obtained by exposing and developing the above-described relief printing plate original, or by exposing and then laser-engraving the relief printing plate original.

For example, in the method of obtaining a relief printing plate by exposure and development, when the resin laminate is not equipped with heat-sensitive mask layer (J) (hereinafter, such resin laminate is referred to as "analog plate") but with cover film (I), cover film (I) is peeled off and a negative or positive original image film is tightly adhered onto image-forming resin layer (H) which is a resin layer, after which the original image film is UV-irradiated to photo-cure image-forming resin layer (H) in an image-like manner. Further, when image-forming resin layer (H), which is a photosensitive resin layer, is a so-called CTP (Computer-to-Plate) plate that comprises heat-sensitive mask layer (J), after cover film (I) is peeled off, an image corresponding to an original image film is drawn using a laser imaging apparatus and the thus drawn image is subsequently UV-irradiated to photo-cure image-forming resin layer (H). The UV irradiation is usually performed using, for example, a high-pressure mercury lamp, an ultrahigh-pressure mercury lamp, a metal halide lamp, a xenon lamp, a carbon arc lamp or a chemical lamp capable of emitting light having a wavelength of 300 to 400 nm. Particularly, when the reproducibility of fine lines and dots is required, it is also possible to perform exposure from the side of support (F) (back exposure) for a short time before peeling off cover film (I).

Then, image-forming resin layer (H) thus photo-cured in an image-like manner is immersed in a developer and a relief image is formed using a brush-type developing apparatus which removes uncured part by rubbing with a brush. Alternatively to a brush-type developing apparatus, it is also possible to use a spray-type developing apparatus. The temperature of the developer at the time of performing development is preferably 15 to 40° C. After formation of a relief image, the resultant is dried at 50 to 70° C. for about 10 minutes, thereby a relief printing plate can be obtained. As required, the thus obtained relief printing plate may further be subjected to a treatment with an active light in the air or vacuum.

In the method of obtaining a relief printing plate by laser engraving, a relief printing plate can be produced by sequentially performing the following steps.

That is, the method comprises:
(1) the step of irradiating the resin laminate with an active light to partially cross-link the image-forming layer; and
(2) the step of engraving the thus partially cross-linked part of the image-forming resin layer with a laser beam.

As required, the method may further comprise the following steps after step (2): (3) the step of rinsing the thus engraved surface with water or a liquid containing water as a main component; (4) the step of drying the engraved image-forming resin layer; and (5) the step of further cross-linking the image-forming resin layer by irradiation with an active light.

Step (1) is a step of photo-curing image-forming resin layer (H), and examples of the active light include visible light, UV light and electron beam, among which UV light is most commonly used. The irradiation is usually performed using, for example, a high-pressure mercury lamp, an ultrahigh pressure mercury lamp, a metal halide lamp, a xenon lamp, a carbon arc lamp or a chemical lamp capable of emitting light having a wavelength of 300 to 400 nm. When a transparent cover film (I) that transmits the active light is arranged, the step of irradiating the active light can be performed either before or after cover film (I) is peeled off or, when the film does not transmit the active light, the irradiation is performed after the film is peeled off. Since polymerization is inhibited in the presence of oxygen, the irradiation of the active light may also be performed after covering the image-forming resin layer with a vinyl chloride sheet and vacuuming the air therebetween. Further, with support (F) side of the image-forming resin layer being defined as the back surface, the active light may be irradiated only on the front surface. However, when support (F) is a transparent film that transmits the active light, the irradiation of the active light can also be performed on the back surface.

Cross-linking of the image-forming layer is advantageous in that, first, it sharpens the relief formed by laser engraving and, secondly, it reduces the tackiness of debris generated by the laser engraving. When non-crosslinked part of the image-forming resin layer is laser-engraved, residual heat transferred to the surroundings of laser-irradiated part is likely to cause melting and deformation of the part that is not originally intended so that a sharp relief may not be obtained. In addition, as general nature of materials, the lower the molecular weight of a material, the more likely the material is liquid rather than solid and thus has stronger tackiness. Accordingly, the tackiness of debris generated by the engraving of the image-forming resin layer for relief formation is stronger when a material having a low molecular weight is used in a greater amount. Since (D) compound having a polymerizable ethylenic double bond, which is a low-molecular-weight compound, yields a polymer when cross-linked, it tends to reduce the tackiness of the debris generated by the engraving.

Step (2) of engraving the thus partially cross-linked part of the image-forming resin layer with a laser beam is a step of subjecting the image-forming resin layer on which a relief is to be formed to scanning irradiation while controlling a laser head using a computer based on digital data of a desired image. When irradiated with an infrared laser, molecules in the image-forming resin layer vibrate to generate heat. The use of a high-power laser such as a carbon dioxide laser or a YAG laser as the infrared laser causes the laser-irradiated part to generate a large amount of heat and the molecules in the resin layer are broken or ionized and thereby selectively removed, that is, engraved. An advantage of laser engraving is that, since the engraving depth can be set arbitrarily, the resulting structure can be controlled three-dimensionally. For example, by engraving shallowly or with shoulders the parts where fine halftone is to be printed, collapse of the resulting relief due to a printing pressure can be inhibited and, by deeply engraving the groove parts where fine reverse characters are to be printed, an ink is made unlikely to fill the grooves and ink filling in the reverse character can thus be inhibited.

When debris generated by the engraving are adhered to the relief surface, step (3) of rinsing the relief surface with water or a liquid containing water as a main component and thereby washing off the debris generated by the engraving may be added. Examples of a rinsing means include a method of washing with running water, a method of jet-spraying water at a high pressure, and a method of brushing the engraved surface mainly in the presence of water using a batch-type or conveyor-type brush-washing machine known as a photosensitive resin relief plate processor. When the slimeness of the debris generated by the engraving cannot be eliminated, a soap-added rinsing liquid may be used as well.

After performing step (3) of rinsing the engraved surface, it is preferred to additionally perform step (4) of drying the engraved image-forming resin layer to evaporate the rinsing liquid.

Further, as required, step (5) of further cross-linking the resin layer by irradiation with an active light may also be added. By performing the additional cross-linking step (5), the relief formed by the engraving can be made stronger.

The laminate is most suitably used as a relief printing plate. However, it can also be used as a planographic printing plate or an intaglio printing plate.

EXAMPLES

Our laminates and plates will now be described in detail by way of examples thereof.

(A) Cationic Polymer

Synthesis of Basic Nitrogen-Containing Polyamide

Synthesis Example 1

In a stainless-steel autoclave, 10 parts by mass of ε-caprolactam, 90 parts by mass of a nylon salt of N-(2-aminoethyl) piperazine and adipic acid and 100 parts by mass of water were placed. After replacing the atmosphere inside the autoclave with nitrogen gas, the materials were heated at 180° C. for 1 hour and water subsequently removed to obtain a water-soluble polyamide resin as a basic nitrogen-containing polyamide (A1).

(B) Anionic Polymer

Carboxylic Acid Modification of Partially Saponified Polyvinyl Acetate

Synthesis Example 2

A partially saponified polyvinyl acetate manufactured by The Nippon Synthetic Chemical Industry Co., Ltd., "KH-17" (polymerization degree: about 1,700, saponification degree: 80% by mol), was swollen in acetone and 1.0% by mol of succinic anhydride added thereto. The resultant was stirred at 60° C. for 6 hours to obtain a carboxylic acid-modified and partially-saponified polyvinyl acetate (B1) in which a carboxyl group was added to the molecular chain. This polymer was washed with acetone and unreacted succinic anhydride removed by drying. The acid value of the polymer was measured to be 10.0 mg KOH/g.

(C) Modified and Partially Saponified Polyvinyl Acetate Having Reactive Group in Side Chain Synthesis Example 3

A partially saponified polyvinyl acetate manufactured by The Nippon Synthetic Chemical Industry Co., Ltd., "KL-05" (polymerization degree: about 500, saponification degree: 80% by mol), was swollen in acetone and 1.0% by mol of succinic anhydride added thereto. The resultant was stirred at 60° C. for 6 hours to add a carboxyl group to the molecular chain. This polymer was washed with acetone and unreacted succinic anhydride removed by drying. The acid value of the polymer was measured to be 10.0 mg KOH/g. Then, 100 parts by mass of this polymer was dissolved in 200 parts by mass of a mixed solvent (ethanol/water=30/70 (mass ratio)) at 80° C. Thereafter, 6 parts by mass of glycidyl methacrylate was added thereto to introduce a reactive group into the partially saponified polyvinyl acetate. As a result of an analysis by a potentiometric titration method, we confirmed that the carboxyl group in the polymer reacted with the epoxy group of glycidyl methacrylate and a methacryloyl group was introduced into a side chain of the polymer, whereby a modified and partially saponified polyvinyl acetate (C1) was obtained as component (C).

Synthesis Example 4

A polymer containing 1% by mol of methacrylic acid as a unit copolymerized with vinyl acetate was saponified to obtain an anion-modified polyvinyl acetate having an average polymerization degree of 650 and a saponification degree of 75% by mol. Then, 100 parts by mass of this polymer was dissolved in 200 parts by mass of a mixed solvent (ethanol/water=30/70 (mass ratio)) at 80° C. Thereafter, 6 parts by mass of glycidyl methacrylate was added thereto to introduce a reactive group into the partially saponified polyvinyl acetate. As a result of an analysis by a potentiometric titration method, we confirmed that the carboxyl group in the polymer reacted with the epoxy group of glycidyl methacrylate and a methacryloyl group was introduced into a side chain of the polymer, whereby a modified and partially saponified polyvinyl acetate (C2) was obtained as component (C).

(D) Compound Having Polymerizable Ethylenic Double Bond

As compounds having a polymerizable ethylenic double bond, those shown in Table 1 were used.

TABLE 1

| | No. | Name | CAS | Molecular weight |
|---|---|---|---|---|
| Compound having a | D1 | Tetrahydrofurfuryl methacrylate | 2399-48-6 | 170 |

TABLE 1-continued

| | No. | Name | CAS | Molecular weight |
|---|---|---|---|---|
| polymerizable ethylenic double bond | D2 | 2-Hydroxy-3-acryloyloxypropyl methacrylate | 1709-71-3 | 214 |
| | D3 | Glycerol dimethacrylate | 1830-78-0 | 228 |
| | D4 | Polyalkylene glycol (PEG200) diacrylate | 26570-48-9 | 304 |

Preparation of Intermediate Laminate 1 Composed of Support (F), First Intermediate Layer (G1) and Second Intermediate Layer (G2-1)

A mixture of 260 parts by mass of "VYLON" (registered trademark) 31SS (a toluene solution of an unsaturated polyester resin, manufactured by Toyobo Co., Ltd.) and 2 parts by mass of "PS-8A" (benzoin ethyl ether, manufactured by Wako Pure Chemical Industries, Ltd.) was heated at 70° C. for 2 hours and then cooled to 30° C. Subsequently, 7 parts by mass of ethylene glycol diglycidyl ether dimethacrylate was added thereto and mixed for 2 hours. Further, 25 parts by mass of "CORONATE" (registered trademark) 3015E (an ethyl acetate solution of a polyvalent isocyanate resin, manufactured by Nippon Polyurethane Industry Co., Ltd.) and 14 parts by mass of "EC-1368" (an industrial adhesive, manufactured by Sumitomo 3M Ltd.) were added, and the resultant mixed to obtain a coating liquid 1 for first intermediate layer (G1) was obtained.

Next, 50 parts by mass of the carboxylic acid-modified and partially-saponified polyvinyl acetate (B1) prepared in Synthesis Example 2 was mixed with a mixed solvent of 200 parts by mass of "SOLMIX" (registered trademark) H-11 (an alcohol mixture, manufactured by Japan Alcohol Trading Co., Ltd.) and 200 parts by mass of water at 70° C. for 2 hours to obtain a coating liquid 1 for second intermediate layer (G2).

The coating liquid 1 for the first intermediate layer (G1) was coated on 250 µm-thick "LUMIRROR" (registered trademark) T60 (a polyester film, manufactured by Toray Industries, Inc.) using a bar coater such that the resulting layer had a post-drying thickness of 30 Then, after removing the solvent by heating the resultant in a 180° C. oven for 3 minutes, the coating liquid 1 for the second intermediate layer (G2) was further coated thereon using a bar coater such that the resulting layer had a dry thickness of 5 µm. Thereafter, the resultant was heated in a 160° C. oven for 3 minutes, thereby an intermediate laminate 1 composed of support (F), first intermediate layer (G1) and second intermediate layer (G2-1) was obtained.

Preparation of Intermediate Laminate 2 Composed of Support (F), First Intermediate Layer (G1) and Second Intermediate Layer (G2-2)

A mixture of 260 parts by mass of "VYLON" (registered trademark) 31SS (a toluene solution of an unsaturated polyester resin, manufactured by Toyobo Co., Ltd.) and 2 parts by mass of "PS-8A" (benzoin ethyl ether, manufactured by Wako Pure Chemical Industries, Ltd.) was heated at 70° C. for 2 hours and then cooled to 30° C. Subsequently, 7 parts by mass of ethylene glycol diglycidyl ether dimethacrylate was added thereto and mixed for 2 hours. Further, 25 parts by mass of "CORONATE" (registered trademark) 3015E (an ethyl acetate solution of a polyvalent isocyanate resin, manufactured by Nippon Polyurethane Industry Co., Ltd.) and 14 parts by mass of "EC-1368" (an industrial adhesive, manufactured by Sumitomo 3M Ltd.) were added, and the resultant was mixed to obtain a coating liquid 1 for first intermediate layer (G1) was obtained.

Next, 5 parts by mass of anionic polymer (B1) prepared in Synthesis Example 2 and 45 parts by mass of a partially saponified polyvinyl acetate, "KH-17" manufactured by The Nippon Synthetic Chemical Industry Co., Ltd. (polymerization degree: about 1,700, saponification degree: 80% by mol), were mixed in a mixed solvent of 200 parts by mass of "SOLMIX" (registered trademark) H-11 (an alcohol mixture, manufactured by Japan Alcohol Trading Co., Ltd.) and 200 parts by mass of water at 70° C. for 2 hours to obtain a coating liquid 2 for second intermediate layer (G2).

The coating liquid 1 for first intermediate layer (G1) was coated on 250 µm-thick "LUMIRROR" (registered trademark) T60 (a polyester film, manufactured by Toray Industries, Inc.) using a bar coater such that the resulting layer had a post-drying thickness of 30 µm. Then, after removing the solvent by heating the resultant in a 180° C. oven for 3 minutes, the coating liquid 2 for the second intermediate layer (G2) was further coated thereon using a bar coater such that the resulting layer had a dry thickness of 5 µm. Thereafter, the resultant was heated in a 160° C. oven for 3 minutes, thereby an intermediate laminate 2 composed of support (F), first intermediate layer (G1) and second intermediate layer (G2-2) was obtained.

Preparation of Intermediate Laminate 3 Composed of Support (F), First Intermediate Layer (G1) and Second Intermediate Layer (G2-3)

A mixture of 260 parts by mass of "VYLON" (registered trademark) 31SS (a toluene solution of an unsaturated polyester resin, manufactured by Toyobo Co., Ltd.) and 2 parts by mass of "PS-8A" (benzoin ethyl ether, manufactured by Wako Pure Chemical Industries, Ltd.) was heated at 70° C. for 2 hours and then cooled to 30° C. Subsequently, 7 parts by mass of ethylene glycol diglycidyl ether dimethacrylate was added thereto and mixed for 2 hours. Further, 25 parts by mass of "CORONATE" (registered trademark) 3015E (an ethyl acetate solution of a polyvalent isocyanate resin, manufactured by Nippon Polyurethane Industry Co., Ltd.) and 14 parts by mass of "EC-1368" (an industrial adhesive, manufactured by Sumitomo 3M Ltd.) were added, and the resultant mixed to obtain a coating liquid 1 for first intermediate layer (G1) was obtained.

Next, 2 parts by mass of anionic polymer (B1) prepared in Synthesis Example 2 and 48 parts by mass of a partially saponified polyvinyl acetate, "KH-17" manufactured by The Nippon Synthetic Chemical Industry Co., Ltd. (polymerization degree: about 1,700, saponification degree: 80% by mol), were mixed in a mixed solvent of 200 parts by mass of "SOLMIX" (registered trademark) H-11 (an alcohol mixture, manufactured by Japan Alcohol Trading Co., Ltd.) and 200 parts by mass of water at 70° C. for 2 hours to obtain a coating liquid 3 for second intermediate layer (G2).

The coating liquid 1 for first intermediate layer (G1) was coated on 250 µm-thick "LUMIRROR" (registered trademark) T60 (a polyester film, manufactured by Toray Industries, Inc.) using a bar coater such that the resulting layer had a post-drying thickness of 30 µm. Then, after removing the solvent by heating the resultant in a 180° C. oven for 3 minutes, the coating liquid 3 for second intermediate layer (G2) was further coated thereon using a bar coater such that the resulting layer had a dry thickness of 5 μm. Thereafter, the resultant was heated in a 160° C. oven for 3 minutes, thereby an intermediate laminate 3 composed of support (F), first intermediate layer (G1) and second intermediate layer (G2-3) was obtained.

Preparation of Intermediate Laminate 4 Composed of Support (F), First Intermediate Layer (G1) and Second Intermediate Layer (G2-4)

A mixture of 260 parts by mass of "VYLON" (registered trademark) 31SS (a toluene solution of an unsaturated polyester resin, manufactured by Toyobo Co., Ltd.) and 2 parts by mass of "PS-8A" (benzoin ethyl ether, manufactured by Wako Pure Chemical Industries, Ltd.) was heated at 70° C. for 2 hours and then cooled to 30° C. Subsequently, 7 parts by mass of ethylene glycol diglycidyl ether dimethacrylate was added thereto and mixed for 2 hours. Further, 25 parts by mass of "CORONATE" (registered trademark) 3015E (an ethyl acetate solution of a polyvalent isocyanate resin, manufactured by Nippon Polyurethane Industry Co., Ltd.) and 14 parts by mass of "EC-1368" (an industrial adhesive, manufactured by Sumitomo 3M Ltd.) were added, and the resultant mixed to obtain a coating liquid 1 for first intermediate layer (G1) was obtained.

Next, 50 parts by mass of a partially saponified polyvinyl acetate, "KH-17" manufactured by The Nippon Synthetic Chemical Industry Co., Ltd. (polymerization degree: about 1,700, saponification degree: 80% by mol), was mixed with a mixed solvent of 200 parts by mass of "SOLMIX" (registered trademark) H-11 (an alcohol mixture, manufactured by Japan Alcohol Trading Co., Ltd.) and 200 parts by mass of water at 70° C. for 2 hours to obtain a coating liquid 4 for second intermediate layer (G2).

The coating liquid 1 for first intermediate layer (G1) was coated on 250 μm-thick "LUMIRROR" (registered trademark) T60 (a polyester film, manufactured by Toray Industries, Inc.) using a bar coater such that the resulting layer had a post-drying thickness of 30 μm. Then, after removing the solvent by heating the resultant in a 180° C. oven for 3 minutes, the coating liquid 4 for second intermediate layer (G2) was further coated thereon using a bar coater such that the resulting layer had a dry thickness of 5 μm. Thereafter, the resultant was heated in a 160° C. oven for 3 minutes, thereby an intermediate laminate 4 composed of support (F), first intermediate layer (G1) and second intermediate layer (G2-4) was obtained.

Preparation of Cover Film (I-1) for Analog Plate

On a 100 μm-thick "LUMIRROR" S10 (a polyester film, manufactured by Toray Industries, Inc.) whose surface had been roughened to have a surface roughness Ra of 0.1 to 0.6 μm, "GOHSENOL" AL-06 (a partially saponified polyvinyl alcohol having a saponification degree of 91 to 94% by mol, manufactured by The Nippon Synthetic Chemical Industry Co., Ltd.) was coated such that the resulting layer had a dry thickness of 1 μm. The resultant was dried at 100° C. for 25 seconds to obtain a cover film I-1 for an analog plate.

Preparation of Cover Film (I-2) for CTP Plate

In a mixture of 40 parts by mass of water, 20 parts by mass of methanol, 20 parts by mass of n-propanol and 10 parts by mass of n-butanol, 10 parts by mass of "GOHSENOL" KL-05 (a polyvinyl alcohol having a saponification degree of 78 to 82% by mol, manufactured by The Nippon Synthetic Chemical Industry Co., Ltd.) was dissolved, thereby a coating liquid for adhesion-adjusting layer (K) was obtained.

A mixture of 23 parts by mass of "MA-100" (carbon black, manufactured by Mitsubishi Chemical Corporation), 1 part by mass of "DIANAL" (registered trademark) BR-95 (an alcohol-insoluble acrylic resin, manufactured by Mitsubishi Rayon Co., Ltd.), 6 parts by mass of a plasticizer "ATBC" (acetyl tributyl citrate, manufactured by J-PLUS Co., Ltd.) and 30 parts by mass of diethylene glycol monoethyl ether monoacetate, which mixture had been prepared in advance, was kneaded and dispersed using a 3-roll mill to prepare a carbon black dispersion. To the thus obtained carbon black dispersion, 20 parts by mass of "ARALDITE 6071" (an epoxy resin, manufactured by Asahi Ciba Co., Ltd.), 27 parts by mass of "U-VAN" (registered trademark) 62 (a melamine resin, manufactured by Mitsui Chemicals, Inc.), 0.7 parts by mass of "LIGHT ESTER P-1M" (a phosphate monomer, manufactured by Kyoeisha Chemical Co., Ltd.) and 140 parts by mass of methyl isobutyl ketone were added, and the resultant was stirred for 30 minutes. Then, methyl isobutyl ketone was further added to a solid concentration of 33% by mass, thereby a coating liquid for heat-sensitive mask layer (J) was obtained.

In a mixture of 55 parts by mass of water, 14 parts by mass of methanol, 10 parts by mass of n-propanol and 10 parts by mass of n-butanol, 11 parts by mass of "GOHSENOL" AL-06 (a polyvinyl alcohol having a saponification degree of 91 to 94% by mol, manufactured by The Nippon Synthetic Chemical Industry Co., Ltd.) was dissolved, thereby a coating liquid for peel assist layer (L) obtained.

On a 100 μm-thick "LUMIRROR" S10 (a polyester film, manufactured by Toray Industries, Inc.) whose surface was not subjected to a roughening treatment, the thus obtained coating liquid for peel assist layer (L) was coated using a bar coater such that the resulting layer would have a dry thickness of 0.25 μm. The resultant was dried at 100° C. for 25 seconds to obtain a laminate of peel assist layer (L) and cover film (I). On the side of peel assist layer (L) of the thus obtained laminate, the coating liquid for heat-sensitive mask layer (J) was coated using a bar coater such that the resulting layer would have a dry thickness of 2 μm. The resultant was subsequently dried at 140° C. for 30 seconds to obtain a laminate of heat-sensitive mask layer (J)/peel assist layer (L)/cover film (I). On the side of heat-sensitive mask layer (J) of the thus obtained laminate, the coating liquid for adhesion-adjusting layer (K) was coated using a bar coater such that the resulting layer would have a dry thickness of 1 μm. The resultant was subsequently dried at 180° C. for 30 seconds to obtain a cover film I-2 for CTP plate, which had a constitution of adhesion-adjusting layer (K)/heat-sensitive mask layer (J)/peel assist layer (L)/cover film (I). The optical density (measured using an orthochromatic filter; transmission mode) of cover film I-2 (laminate of K/J/L/I) was determined to be 3.6, taking the value of cover film (I) as 0.

Preparation of Composition Solution 1 for Image-Forming Resin Layer

Components (A) and (C) shown in Table 2 were added to a three-necked flask equipped with a stirring blade and a condenser tube, and these components were then mixed with a mixed solvent composed of 50 parts by mass of "SOLMIX" (registered trademark) H-11 (an alcohol mixture, manufactured by Japan Alcohol Trading Co., Ltd.) and 50 parts by mass of water. The resulting mixture was heated with stirring at 90° C. for 2 hours to dissolve components (A) and (C). After cooling the resultant to 70° C., other components were added thereto and the resulting mixture stirred for 30 minutes to obtain a composition solution 1 for image-forming resin layer.

Production of Sheet H1 for Image-Forming Resin Layer

The thus obtained composition solution 1 was flow-cast on a polyester film and dried at 60° C. for 2 hours. The film was then removed to obtain a 650 μm-thick photosensitive resin sheet H1. The thickness of this photosensitive resin sheet H1 was adjusted by placing a spacer of a prescribed thickness on a substrate and scraping out the composition solution 1 from a protruding part using a horizontal metal ruler.

Sheets H2 to H5 for image-forming resin layer were each prepared in the same manner as the sheet 1 using the components shown in Table 2.

(ii) CTP Plate

From a 10 cm×10 cm printing plate original, only the polyester film of cover film (I-2) for CTP plate was peeled off (after the peeling, peel assist layer (L) constituted the outermost surface of the photosensitive printing plate original), and the printing plate original was mounted on an external drum-type plate setter, "CDI SPARK" (manufactured by Esko-Graphics Co., Ltd.) equipped with a fiber laser whose emission is in the infrared region such that the support side came into contact with the drum. Subsequently, a test pattern (having 150-line 4% halftone, 50 μm-width fine lines, φ120-μm dots and 300 μm-width reverse lines) was drawn at a laser output of 9 kW and a drum rotation rate of 700 rpm, and an image mask (J-1) was formed from heat-sensitive mask layer (J). Then, the side of the heat-sensitive mask layer was exposed in the air under a chemical

TABLE 2

| | | | Sheet for image-forming layer | | | | |
|---|---|---|---|---|---|---|---|
| | | | H1 | H2 | H3 | H4 | H5 |
| Amount (parts by mass) | Component (A) | A1 | 7.5 | 3 | 20 | 0 | 7.5 |
| | Component (C) | C1 | 50 | 50 | 40 | 60 | — |
| | | C2 | — | — | — | — | 50 |
| | Component (D) | D1 | 10 | 10 | 10 | 10 | 10 |
| | | D2 | 4 | 4 | 4 | 4 | 4 |
| | | D3 | 3 | 3 | 3 | 3 | 3 |
| | | D4 | 11 | 11 | 11 | 11 | 11 |
| | Component (E) | 2,2-Dimethoxy-1,1-diphenylethan-1-one | 1.3 | 1.3 | 1.3 | 1.3 | 1.3 |
| | Plasticizer | Pentaerythritol polyoxyethylene ether | 10 | 10 | 10 | 10 | 10 |
| | Polymerization inhibitor | N-(Ammoniumoxy)-N-nitrosophenylamine | 0.2 | 0.2 | 0.2 | 0.2 | 0.2 |
| | UV absorber | 2,4-Di-tert-butyl-6-(5-chloro-2H-1,2,3-benzotriazol-2-yl)phenol | 0.02 | 0.02 | 0.02 | 0.02 | 0.02 |

Evaluation Methods

Evaluations in Examples and Comparative Examples were performed by the following methods.

(1) Evaluation of Image Reproducibility of Printing Plate Original (i) In the Case of Analog Plate From a 10 cm×10 cm photosensitive relief printing plate original, only the polyester film of cover film (I-1) was peeled off (after the peeling, the partially saponified polyvinyl alcohol layer having a dry thickness of 1 μm constituted the outermost surface of the printing plate original), and a gray-scale negative film for sensitivity measurement and a negative film for evaluation of image reproducibility (which had 150-line 4% halftone and φ200 dots) were vacuum-adhered thereto. The resulting printing plate original was exposed using a chemical lamp, 20-Watt FL20SBL-360 (manufactured by Mitsubishi Electric Osram Ltd.), under such a condition where a gray-scale sensitivity of 16±1 steps (21-step Sensitivity Guide, manufactured by Stouffer Graphic Arts Equipment Co.) was attained (main exposure). Then, using a brush-type developing apparatus having a developer temperature of 25° C., the thus exposed printing plate original was developed and subsequently dried at 60° C. for 10 minutes. Thereafter, the printing plate original was further subjected to post exposure using a chemical lamp 20-Watt FL20SBL-360 (manufactured by Mitsubishi Electric Osram Ltd.) under the same conditions as the main exposure, thereby a printing plate for evaluation of image reproducibility was obtained.

lamp 20-Watt FL20SBL-360 (manufactured by Mitsubishi Electric Osram Ltd.) (main exposure). The time of the main exposure was twice as long as the time of the main exposure required for an analog plate having the same photosensitive resin layer. Thereafter, using a brush-type developing apparatus having a developer temperature of 25° C., the thus exposed printing plate original was developed and subsequently dried at 60° C. for 10 minutes. The printing plate original was further subjected to post exposure under the same conditions as in the main exposure, thereby a printing plate for evaluation of image reproducibility was obtained.

For each of the thus obtained printing plates, the halftone and dots were evaluated.

Half-tone: A 150-line 4% halftone formed in an area of 1 cm×1 cm was observed under a magnifying glass at a magnification of ×20 and, based on the following scoring criteria, whether or not the halftone was reproduced at a site of tight adhesion with a negative film was evaluated. A score of 4 or higher was regarded as satisfactory.

5: No defective halftone was observed.
4: The area of the outermost periphery was observed with defective halftone.
3: The areas of the outermost periphery and the second row therefrom were observed with defective halftone.
2: The interior areas including the third row from the outermost periphery were observed with defective halftone.
1: Defective halftone was observed in 20% or more of the entire halftone area.

(iii) Laser Engraving Plate

The entire surface of cover film (I) side of a 600 μm-thick printing plate original for laser engraving was exposed in the air using a platemaker DX-A3 (manufactured by Takano Machinery Works, Co., Ltd.) equipped with a chemical lamp 20-Watt FL20SBL-360 (manufactured by Mitsubishi Electric Osram Ltd.) (exposure dose: 2,400 mJ/cm$^2$). Only the polyester film of cover film (I) was peeled off (after the peeling, the partially saponified polyvinyl alcohol layer having a dry thickness of 1 μm constituted the outermost surface of the photosensitive printing plate original), and the printing plate original was laser-engraved using Adflex Direct 250L (manufactured by Comtecs Co., Ltd.) (engraving speed: 1,000 cm/s, pitch: 10 μm, top: 10%, bottom: 100%, width: 0.3 mm) to form a 150-Lpi, 1%-halftone relief.

Then, the resulting printing plate original was rinsed with 25° C. tap water for 5 seconds using the platemaker DX-A3 and subsequently dried at 60° C. for 10 minutes using a hot-air dryer. The entire surface of the printing plate original was once again exposed in the air under a chemical lamp (exposure dose: 2,400 mJ/cm$^2$) to obtain a printing plate for evaluation of image reproducibility.

For the thus obtained printing plate, after rinsing, the presence or absence of debris generated by the engraving was verified under a loupe having a magnification of ×25 and the depth of the 150-Lpi, 1% halftone was measured under a laser microscope VK9500 (manufactured by Keyence Corporation). A halftone depth of 50 μm or greater was regarded as satisfactory.

(2) Measurement of Adhesive Strength Between Resin Layer and Intermediate Layer (i) Analog Plate From a 2 cm×30 cm printing plate original, only the polyester film of cover film (I-1) was peeled off (after the peeling, the partially saponified polyvinyl alcohol layer having a dry thickness of 1 μm constituted the outermost surface of the photosensitive printing plate original), and the printing plate original was exposed in the air under a chemical lamp, 20-Watt FL20SBL-360 (manufactured by Mitsubishi Electric Osram Ltd.), under such a condition where a gray-scale sensitivity of 16±1 steps was attained (main exposure). Subsequently, from one side of the longitudinal direction, the intermediate layer and resin layer were peeled off from one another, and the resin layer and intermediate layer/substrate were each set on two chucks, which were apart by 36 mm, of a TENSILON universal material tester UTM-4-100 (manufactured by Toyo Boldwin Co., Ltd.) equipped with a 50N load cell and then pulled apart at a rate of 100 mm/min. The adhesive strength between the resin layer and intermediate layer was determined from the average value of the maximum and minimum stresses required to detach the resin layer and intermediate layer at the adhered part, and the thus obtained value of the adhesive strength was divided by the sample width (2 cm) to determine the adhesive strength per with of 1 cm. An adhesive strength of 2 N/cm or greater was regarded as satisfactory. When adhesion between the resin layer and intermediate layer was strong and these layer could thus not be detached from one another, an evaluation of "H" was given.

(ii) CTP Plate

From a 40 cm×40 cm printing plate original, only the polyester film of cover film (I-2) for CTP plate was peeled off (after the peeling, peel assist layer (L) constituted the outermost surface of the printing plate original), and the printing plate original was mounted on an external drum-type plate setter, "CDI SPARK" (manufactured by Esko-Graphics Co., Ltd.) equipped with a fiber laser whose emission is in the infrared region such that the support side came into contact with the drum. Subsequently, the heat-sensitive mask layer was removed at a laser output of 9 kW and a drum rotation rate of 700 rpm. Then, a sample of 2 cm×30 cm was prepared and its heat-sensitive mask layer side was exposed in the air under a chemical lamp 20-Watt FL20SBL-360 (manufactured by Mitsubishi Electric Osram Ltd.) (main exposure). The time of the main exposure was twice as long as the time of the main exposure required for an analog plate having the same image-forming resin layer. Thereafter, from one side of the 2-cm width, the intermediate layer and resin layer were peeled off from one another, and the resin layer and intermediate layer/substrate were each set on two chucks, which were apart by 36 mm, of a TENSILON universal material tester UTM-4-100 (manufactured by Toyo Boldwin Co., Ltd.) equipped with a 50N load cell and then pulled apart at a rate of 100 mm/min. The adhesive strength between the resin layer and intermediate layer was determined from the average value of the maximum and minimum stresses required to detach the resin layer and intermediate layer at the adhered part, and the thus obtained value of the adhesive strength was divided by the sample width (2 cm) to determine the adhesive strength per with of 1 cm.

(iii) Laser Engraving Plate

The adhesive strength was determined in the same manner as in the analog plate.

Example 1

Production of Printing Plate Original 1

Ethanol was coated on one side of the above-obtained sheet (H1) for image-forming resin layer, and sheet (H1) was press-adhered to the intermediate layer side of the laminate 1. On the image-forming resin layer of the resulting laminate, a mixed solvent (water/ethanol=50/50 (mass ratio)) was coated, and cover film (I-1) for analog plate was press-adhered thereon to obtain a printing plate original 1. The thus obtained printing plate original was evaluated in accordance with the evaluation methods for the analog plate. The results thereof are shown in Table 3.

Example 2

Production of Printing Plate Original 2

A mixed solvent (water/ethanol=50/50 (mass ratio)) was coated on one side of the above-obtained sheet (H1) for image-forming resin layer, and this sheet (H1) was press-adhered to the intermediate layer side of the laminate 1. On the image-forming resin layer of the resulting laminate, a mixed solvent (water/ethanol=50/50 (mass ratio)) was coated, and the cover film (I-2) for CTP plate press-adhered thereon to obtain a printing plate original 2. The thus obtained printing plate original was evaluated in accordance with the evaluation methods for CTP plate. The evaluation results are shown in Table 3.

Example 3

The printing plate original 1 was evaluated in accordance with the evaluation methods for laser engraving. The evaluation results are shown in Table 3.

Examples 4 to 8 and Comparative Examples 1 to 3

Each printing plate original was produced and evaluated in the same manner as in Example 1, except that the sheet for image-forming resin layer and the laminate shown in Table 3 were used. The evaluation results are shown in Table 3. It is seen therefrom that the adhesive strength is improved by incorporating a cationic polymer into the image-forming resin layer and an anionic polymer into the intermediate layer in contact with the image-forming resin layer.

TABLE 3

| | | Example 1 | Example 2 | Example 3 | Example 4 | Example 5 | Example 6 | Example 7 | Example 8 | Comparative Example 1 | Comparative Example 2 | Comparative Example 3 |
|---|---|---|---|---|---|---|---|---|---|---|---|---|
| Image-forming resin sheet | | H1 | H1 | H1 | H2 | H3 | H2 | H2 | H5 | H4 | H1 | H4 |
| Intermediate Laminate | | 1 | 1 | 1 | 1 | 1 | 2 | 3 | 1 | 1 | 4 | 4 |
| Cover film | | I-1 | I-2 | I-1 | I-1 | I-1 | I-1 | I-1 | I-1 | I-1 | I-1 | I-1 |
| Adhesive strength (N/cm) | | H | H | H | 3.3 | H | 2.4 | 2.1 | H | 1.2 | 1.0 | 1.1 |
| Image reproducibility | Halftone (score) | 5 | 5 | — | 5 | 5 | 5 | 5 | 5 | 5 | 5 | 5 |
| | Depth of 150-Lpi, 1% halftone (μm) | — | — | 100 | — | — | — | — | — | — | — | — |
| | Residual debris generated by engraving | — | — | none | — | — | — | — | — | — | — | — |

The invention claimed is:

1. A resin laminate having a structure in which a support, an intermediate layer and an image-forming resin layer are laminated in the order mentioned,
 the resin laminate comprising:
 (A) a cationic polymer in the image-forming resin layer;
 (B) an anionic polymer in the intermediate layer in contact with the image-forming resin layer, wherein the (B) anionic polymer is a modified and partially saponified polyvinyl acetate in which a carboxyl group is introduced to a polymer side chain using a hydroxyl group of a partially saponified polyvinyl acetate as an origin of introduction, and
 the image-forming resin layer comprises:
 the (A) cationic polymer;
 (C) a partially saponified polyvinyl acetate having 1) a side chain comprising a reactive functional group that is a non-aromatic unsaturated carbon-carbon bond, and 2) a saponification degree of 40 to 100% by mol,
 (D) a compound having a polymerizable ethylenic double bond; and
 (E) a photopolymerization initiator.

2. The resin laminate according to claim 1, wherein the intermediate layer comprises a first intermediate layer and a second intermediate layer in that order from the side of the support, and the second intermediate layer in contact with the image-forming resin layer comprises the (B) anionic polymer.

3. The resin laminate according to claim 1, wherein the image-forming resin layer is a photosensitive resin layer.

4. The resin laminate according to claim 1, wherein the (A) cationic polymer is an amino group-containing polymer.

5. The resin laminate according to claim 1, wherein the (A) cationic polymer is a piperazine ring-containing polyamide.

6. The resin laminate according to claim 1, wherein the (B) anionic polymer comprises a carboxyl group, a sulfonate group, a phosphate group, or a salt thereof.

7. The resin laminate according to claim 1, wherein the (B) anionic polymer is a water-soluble or water-dispersible copolymer comprising a carboxyl group, a sulfonate group, a phosphate group, or a salt thereof.

8. The resin laminate according to claim 1, formed by laminating the image-forming resin layer on the intermediate layer arranged on the support.

9. A relief printing plate original comprising the resin laminate according to claim 1.

10. The resin laminate according to claim 1, wherein the total amount of an acidic group and an anionic group in the (B) anionic polymer is not less than 0.1 mol/kg.

* * * * *